US008131794B2

(12) United States Patent
Ito

(10) Patent No.: US 8,131,794 B2
(45) Date of Patent: Mar. 6, 2012

(54) RAID SYSTEM AND GALOIS FIELD PRODUCT COMPUTATION METHOD

(75) Inventor: Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1109 days.

(21) Appl. No.: 12/004,826

(22) Filed: Dec. 21, 2007

(65) Prior Publication Data

US 2008/0177815 A1 Jul. 24, 2008

(30) Foreign Application Priority Data

Jan. 19, 2007 (CN) ................................ 2007-010204

(51) Int. Cl.
*G06F 15/00* (2006.01)
*G06F 11/00* (2006.01)

(52) U.S. Cl. ....................................... 708/492; 714/6.22

(58) Field of Classification Search .................. 708/492; 714/6.22

See application file for complete search history.

(56) References Cited

U.S. PATENT DOCUMENTS

| | | | | |
|---|---|---|---|---|
| 5,448,510 | A * | 9/1995 | Lee | 708/492 |
| 6,148,430 | A * | 11/2000 | Weng | 714/770 |
| 7,392,458 | B2 * | 6/2008 | Forhan et al. | 714/770 |
| 7,664,915 | B2 * | 2/2010 | Gopal et al. | 711/114 |
| 2002/0156823 | A1 * | 10/2002 | Weng et al. | 708/492 |

FOREIGN PATENT DOCUMENTS

JP A 2000-259359 9/2000

OTHER PUBLICATIONS

First Office Action issued by SIPO on May 8, 2009.

Peter Anvin, "The mathematics of RAID-6,"Dec. 1, 1994, http://www.kernel.org/pub/linux/kernel/peopel/hpa/raid6.pdf.

Anonymous; "RAID" Internet Article, Wikipedia, [online] XP002483681; Retrieved from the Internet; http://en.wikipedia.org/w/index-php?title=RAID&oldid=1015816; Jan. 18, 2007; pp. 1-5.

* cited by examiner

*Primary Examiner* — Chuong D Ngo
(74) *Attorney, Agent, or Firm* — Greer, Burns & Crain, Ltd.

(57) ABSTRACT

Described is an apparatus for performing a Galois field product computation on data. A first symbol data includes a plurality of symbols each being a bit sequence on which a product operation by a factor α is to be performed in a Galois field, where α is a primitive element of the Galois field, is acquired. A factor α computation is performed on the first symbol data by performing a bit shift operation on the first symbol data toward high-order bit position, generating first mask data from the first symbol data, generating first correction data by computing a logical AND of the first mask data and a first symbol correction value, generating a factor α computation result by computing a XOR of the second symbol data and the first correction data.

11 Claims, 17 Drawing Sheets

FIG. 2

| |
|---|
| $P = D_1 + D_2 + \cdots + D_{14}$ |
| $Q = \alpha^0 \times D_1 + \alpha^1 \times D_2 + \alpha^2 \times D_3 + \alpha^{12} \times D_{13} + \alpha^{13} \times D_{14}$ |
| Primitive polynomial for $GF(2^{16}) = X^{16} + X^{12} + X^3 + X + 1$ |
| $v32768 = \underbrace{1\,0\,0\,0\,0\,0\,0\,0\,0\,0\,0\,0\,0\,0\,0\,0}_{16\ \text{bits}}$ |
| $v4107 = 2^{12} + 2^3 + 2 + 1$ |

FIG. 5

$D_{i=2}$ data: ··· 82, 36934, 12668, 53000, 38338, 31448, 22956, 58716, ··· v32768 = (32768, 32768, 32768, 32768, 32768, 32768, 32768, 32768,)

v4107 = (4107, 4107, 4107, 4107, 4107, 4107, 4107, 4107)

⇩

| operation | data |
|---|---|
| Xmm1 = | (82, 36934, 12668, 53000, 38338, 31448, 22956, 58716) |
| xmm2 = xmm1 << 1 | (<u>164</u>, <u>8332</u>, <u>25336</u>, <u>40464</u>, <u>11140</u>, <u>62896</u>, <u>45912</u>, <u>51896</u>) |
| Xmm1 = xmm1 & v32768 | (0, 32768, 0, 32768, 32768, 0, 0, 32768) |
| Xmm1 = if (xmm1 = v32768) | (0, 65535, 0, 65535, 65535, 0, 0, 65535) |
| Xmm1 = xmm1 & v4107 | (0, <u>4107</u>, 0, <u>4107</u>, <u>4107</u>, 0, 0, <u>4107</u>) |
| Xmm1 = xmm1 ^ xmm2 | (<u>164</u>, <u>12423</u>, <u>25336</u>, <u>36379</u>, <u>15247</u>, <u>62896</u>, <u>45912</u>, <u>55987</u>) |

FIG. 8

| |
|---|
| $P = D_1 + D_2 + D_3 + \cdots + D_{14}$ |
| $Q = \alpha^0 \times D_1 + \alpha^1 \times D_2 + \alpha^2 \times D_3 + \cdots + \alpha^2 \times D_8 + \alpha^{-1} \times D_9 + \cdots + \alpha^{-5} \times D_{13} + \alpha^{-6} \times D_{14}$ |
| Primitive polynomial for $GF(2^{16})$ $= X^{16} + X^{12} + X^3 + X + 1$ |
| $v1 = \underbrace{0\,0\,0\,0\,0\,0\,0\,0\,0\,0\,0\,0\,0\,0\,0\,1}_{16 \text{ bits}}$ |
| $v34821 = 2^{15} + 2^{11} + 2^2 + 1$ $( = ( X^{16} + X^{12} + X^3 + x ) / x )$ |

FIG. 10

| OPERATION | |
|---|---|
| (1) | xmm1 = |
| (2) | xmm2 = xmm1 >> 1 |
| (3) | xmm1 = xmm1 & v1 |
| (4) | xmm1 = if (xmm1 = v1) |
| (5) | xmm1 = xmm1 & v34821 |
| (6) | xmm1 = xmm1 ^ xmm2 |

FIG. 15

PRIOR ART

| |
|---|
| $P = D_1 + D_2 + D_3$ |
| $Q = \alpha^0 \times D_1 + \alpha^1 \times D_2 + \alpha^2 \times D_3$ |
| [GALOIS FIELD]<br>A finite number of Points. $GF(2^{16}) \ni 0, \alpha^0, \alpha^1, \ldots, \alpha^{65534}$<br>Four Arithmetic Operations: $\alpha^1 + \alpha^1 = 0,\ \alpha^2 \times \alpha^3 = \alpha^5$ |

RAID SYSTEM AND GALOIS FIELD PRODUCT COMPUTATION METHOD

BACKGROUND OF THE INVENTION

1. Field of the Invention

The present invention relates to redundant array of independent disks (RAID) systems for computing data parities by means of Galois field computation and also to Galois field product computation methods. More particularly, the invention relates to a RAID system and a Galois field product computation method suitable for recovering data from dual-disk failures.

2. Description of the Related Art

One approach to recovering data from dual-disk failures is RAID-6. In this RAID-6 scheme, a linear redundancy technique has been proposed, as disclosed in, for example, Japanese Unexamined Patent Application Publication No. 2000-259359 (FIGS. 5 and 6).

This technique is described below in the context of the configuration of the RAID-6 system shown in FIG. 14. Three data disk units (hard disk drives) 101, 102, and 103 and two parity disk units (hard disk drives), i.e., first and second disk units 104 and 105, are connected to a RAID controller 110.

In the linear redundancy technique, two parities are generated from data. The first parity P is generated, as shown in FIG. 15, as a result of adding data items D1, D2, and D3, i.e., calculating exclusive OR (XOR), as in the known RAID-5 scheme. The first parity P is stored in the first parity disk unit 104. The sign "+" shown in FIG. 15 represents XOR.

The second parity Q is generated by weighting the data items D1, D2, and D3 by means of Galois field product computation and by computing XOR of the resulting values. The second parity Q is stored in the second parity disk unit 105.

One Galois field generator is assigned to each of the data disk units 101, 102, and 103. In order to recover data from dual-disk failures, it is necessary that the Galois field generators assigned to the data disk units 101, 102, and 103 be different from each other. For example, if the number of data bits is 16, as shown in FIG. 15, $2^{16}$ finite elements are provided as the Galois field GF($2^{16}$). Additionally, four arithmetic operations can be performed on the Galois field according to a predetermined rule. The linear redundancy technique allows distribution of parities and is effective for detecting the occurrence of dual-disk failures and recovering data from such failures.

In generating parities utilizing a Galois field, as shown in FIG. 15, two variables, such as data and Galois field, are necessary for executing Galois field product computation. Accordingly, a longer processing time is required for generating parities than that for XOR computation of the RAID-5 scheme, i.e., computation of the ordinary parity P. Accordingly, the performance is reduced.

To simplify Galois field product computation, algorithms for weighting (product computation) a plurality of pieces of data by a factor α by means of shift, AND, XOR operations have been proposed, as disclosed in, for example, "The mathematics of RAID-6" by H. Peter Anvin, online paper, http://kernel.org/pub/linux/kernel/people/hpa/raid-6.pdf, accessed on Oct. 26, 2006). In this paper, expressions for generating parities and for recovering data when 8-bit data is used are disclosed from page 4 to page 5, and algorithms for weighting (product computation) by a factor α are described in the C language from the bottom column of page 6 to page 7.

The algorithms described in the C language are discussed below with reference to FIGS. 16 and 17 in the context of four symbol data, each symbol being represented by 8 bits. In FIG. 16, v represents subject data (32 bits) having four 8-bit symbols.

In step S100, the subject data v having four 8-bit symbols stored in a disk unit is loaded into a 32-bit register. Then, in step S101, the entire subject data v is shifted to the left (i.e., to a higher order) by one bit. The value of the resulting data v<<1 is as twice as large as that of the subject data v in units of 32 bits.

Then, in step S102, the bits of the shifted data v<<1 that have influenced other symbols by shifting the data v are masked. By the use of the mask value 0xfefefefe, the logical AND of the shifted data v<<1 and the mask value is computed so that the masked data vv is obtained. By this operation, the values of the rightmost bits (i.e., bits influenced by shifting the data v) of the four symbols are set to be 0. That is, an influence on the rightmost bit of a subject symbol by the most significant bit (MSB) of the right-adjacent symbol, which is caused by shifting all the 32 bits, can be prevented.

Subsequently, in step S103, the mask (v) function is generated, as shown in FIG. 17, from the subject data v. The MASK (v) function is generated such that, if the leftmost bit of an 8-bit symbol is 1, 8 bits "1.1111111" are set in that symbol, and if the leftmost bit of an 8-bit symbol is 0, 8 bits "00000000" are set in that symbol. That is, the mask (v) function is generated such that 8 bits of 1's are set for a symbol in which a carry is generated by shifting the subject data v and such that 8 bits of 0's are set for a symbol in which a carry is not generated by shifting the subject data v.

Details of the generation of the mask (v) function are given by the flowchart in FIG. 17. In step S110, logical AND of the subject data v and the mask value "0x80808080" in which 1 appears at 8 bit intervals and 0's are set in the other bit positions is computed. This mask value extracts the MSB of each symbol.

Then, in step S112, the logical AND value is shifted to the left by one bit, resulting in 32-bit data v<<1 (doubled data), and also, the logical AND value is shifted to the right by 7 bits, resulting in 32-bit data v>>7 (1/128 data). Then, the 32-bit data v>>7 is subtracted from the 32-bit data v<<1, resulting in the mask (v) function MASK(v). This function serves to distinguish symbols whose MSBs are 1 from symbols whose MSBs are not 1.

In step S104 in FIG. 16, logical AND of the coefficient value "0x1d1d1d1d" corresponding to a polynomial ($=x^8+x^2+1$) for generating an 8-bit Galois field GF($2^8$) and the mask (v) function MASK(v) is computed. That is, among the four symbols, only the symbols whose MSBs are 1 are substituted by "00011101" of the coefficient value "0x1d1d1d1d".

In step S105, XOR of the logical AND result and the masked subject data vv computed in step S102 is computed, resulting in the subject data v multiplied by a factor α, i.e., α·v. By repeating those steps once again, data $\alpha^2 \cdot v$ can be obtained. Similarly, data $\alpha^n \cdot v$ can be obtained, where n is the number of times for which the above-described steps are repeated.

In the above-described related art, nine steps, i.e., a substitution step in step S100, a shift step in step S101, an AND step in step S102, an AND step, two shift steps, and one subtraction step in step S103 (FIG. 17), one AND step in step S104, and an XOR step in step S105, are required for implementing parallel processing for Galois field product computation on several symbols (four symbols in the example of the related art).

SUMMARY

In the above-described Galois field product computation of the related art, parallel processing for a plurality of symbols (four symbols in the example of the related art) can be implemented. However, nine steps are required for multiplying the four symbols by a factor α. Accordingly, to multiply the four symbols by $\alpha^n$, the number of computations for 9·n steps is required.

Particularly, in accordance with a recent increase in the storage capacity, the number of symbols (the number of data disk units) of subject data is also increasing. For example, if the RAID-6 system is configured such that 14 data disk units are provided for two parity disk units, it is necessary that the symbols be multiplied by $\alpha^{13}$, which means that 9·13=117 steps are required. It is thus desirable to reduce the number of steps.

If computation is performed by repeating steps, to increase the computation speed, it is demanded that the number of repetitions of the steps or the number of loops for product computation algorithms be small.

Not only in the data generation processing, but also in the data reconstruction processing, it is also desirable to reduce the number of repetitions of steps for Galois field product computation to obtain a short processing time.

Accordingly, it is an object of the present invention to provide a RAID system and a Galois field product computation method in which a processing time for Galois field computation can be reduced.

It is another object of the present invention to provide a RAID system and a Galois field product computation method in which the number of steps for parallel processing for Galois field computation can be reduced.

It is still another object of the present invention to provide a RAID system and a Galois field product computation method in which the number of repetitions of steps for parallel processing for Galois field computation can be reduced.

According to an embodiment of the present invention, there is provided a method for performing a Galois field product computation on data. The method comprises acquiring a first symbol data including a plurality of symbols each being a bit sequence on which a product operation by a factor α is to be performed in a Galois field, where α is a primitive element of the Galois field, performing a factor α computation comprising generating a second symbol data by performing a bit shift operation on the first symbol data toward high-order bit position, generating first mask data from the first symbol data, by substituting 1 into all the bits of a symbol thereof having a carry bit to be generated by the bit shift operation and by substituting 0 into all the bits of the other symbols thereof, generating first correction data by computing a logical AND of the first mask data and a first symbol correction value which is determined on the basis of a primitive polynomial for the Galois field, generating a factor α computation result by computing a XOR of the second symbol data and the first correction data, the factor α computation result including the plurality of symbols each including a result of a product operation of the factor α and the corresponding symbol included in the first symbol data in the Galois field, and storing the factor α computation result into the first symbol data as a new first symbol data. Then the factor α computation is repeated a repetition number M times on the first symbol data where M is an integer greater than or equal to 0, so as to weight each symbol included in the first symbol data with a weighting value of a factor $\alpha^M$.

According to another embodiment of the present invention, there is provided a method comprising performing a factor $\alpha^{-1}$ computation comprising generating a third symbol data by performing a bit shift operation on the first symbol data toward low-order bit position, generating second mask data from the first symbol data, by substituting 1 into all the bits of a symbol thereof having a underflow bit to be generated by the bit shift operation thereon and by substituting 0 into all the bits of the other symbols thereof, generating second correction data by computing a logical AND of the second mask data and a second symbol correction value which is determined on the basis of the primitive polynomial for the Galois field, generating a factor $\alpha^{-1}$ computation result by computing a XOR of the second symbol data and the second correction data, the factor $\alpha^{-1}$ computation result including the plurality of symbols each including a result of a product operation of the factor $\alpha^{-1}$ and the corresponding symbol included in the first symbol data in the Galois field. Then the factor $\alpha^{-1}$ computation is repeated a repetition number K times on the first symbol data where K is an integer greater than or equal to 0, so as to weight each symbol included in the first symbol data with a factor of $\alpha^{-K}$.

BRIEF DESCRIPTION OF THE DRAWINGS

FIG. 2 illustrates parity computation processing using a Galois field in accordance with an embodiment of the present invention;

FIG. 5 illustrates a specific example of the product computation shown in FIG. 4;

FIG. 8 illustrates the product computation processing shown in FIG. 7;

FIG. 10 illustrates an operation for the product computation processing shown in FIG. 9;

FIG. 15 illustrates parity data employed in an example of a RAID-6 system of the related art;

DESCRIPTION OF THE PREFERRED EMBODIMENTS

The present invention is described below in the order of a RAID system, Galois field product computation in accordance with an embodiment, Galois field production computation in accordance with another embodiment, Galois field production computation in accordance with still another embodiment, and modified examples. However, the present invention is not restricted to this configuration.

Figure 1:
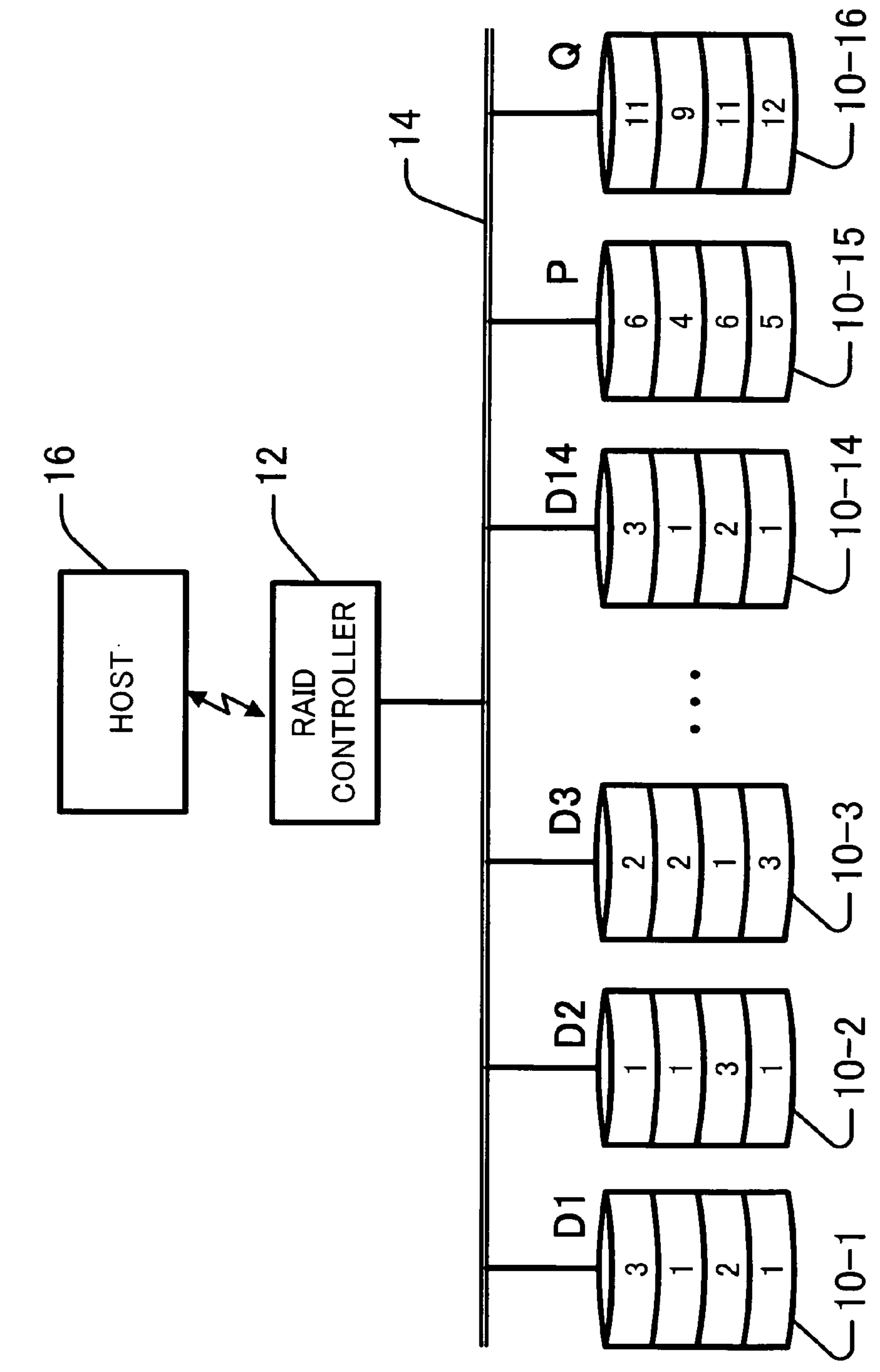
FIG. 1 is a block diagram illustrating a RAID system in accordance with an embodiment of the present invention.

FIG. 1 is a block diagram illustrating a RAID system in accordance with an embodiment of the present invention. FIG. 2 illustrates parity computation using a Galois field performed by the RAID system shown in FIG. 1. The RAID system includes, as shown in FIG. 1, a RAID controller 12 connected to a host computer 16, a plurality of (14 in this embodiment) data disk units (hard disk drives) 10-1 through 10-14, and first and second parity disk units (hard disk drives) 10-15 and 10-16, which are connected to the RAID controller 12 with, for example, a fiber channel (FC) loop 14 and are controlled by the RAID controller 12. That is, the RAID system shown in FIG. 1 has a RAID-6 configuration having dual parities.

The first parity P is generated, as shown in FIG. 2, by computing XOR of string data D1 through D14 in the data disk units 10-1 through 10-14, respectively, and is stored at the corresponding address of the first parity disk unit 10-15. The second parity Q is generated, as shown in FIG. 2, by weighting the string data D1 through D14 in the data disk units 10-1 through 10-14, respectively, by means of Galois field product computation and by computing XOR of the resulting weighted data. The second parity Q is stored at the corresponding address of the second parity disk unit 10-16. That is, the second parity Q is expressed by the following equation (1).

$$Q=\alpha^0\times D_1+\alpha^1\times D_2+\alpha^2\times D_3+\ldots+\alpha^{12}\times D_{13}+\alpha^{13}\times D_4 \qquad (1)$$

where sign + in equation (1) represents XOR computation. The parity computation is executed by the RAID controller 12. If one symbol has 16 bits, the Galois field is $GF(2^{16})$, and the primitive polynomial is expressed by the following equation (2) and a primitive element is expressed as a in this embodiment.

$$X^{16}+X^{12}+X^3+X+1 \qquad (2)$$

In this embodiment, the value "32768", in which only the MSB of the 16-bit data is 1, is used for generating mask data (a first mask data) for the Galois field product computation using a factor α. The value "4107", which is used as a first symbol correction value, is obtained by substituting 2 into x, except for x in $x^{16}$, of the primitive polynomial expressed by equation (2).

When writing data into the data disk units 10-1 through 10-14, the RAID controller 12 calculates the first parity P by means of XOR computation and stores the calculated first parity P in the first parity disk unit 10-15, and also calculates the second parity Q by performing Galois field product computation and XOR computation, which are discussed below, and stores the calculated second parity Q in the second parity disk unit 10-16.

Figure 3:
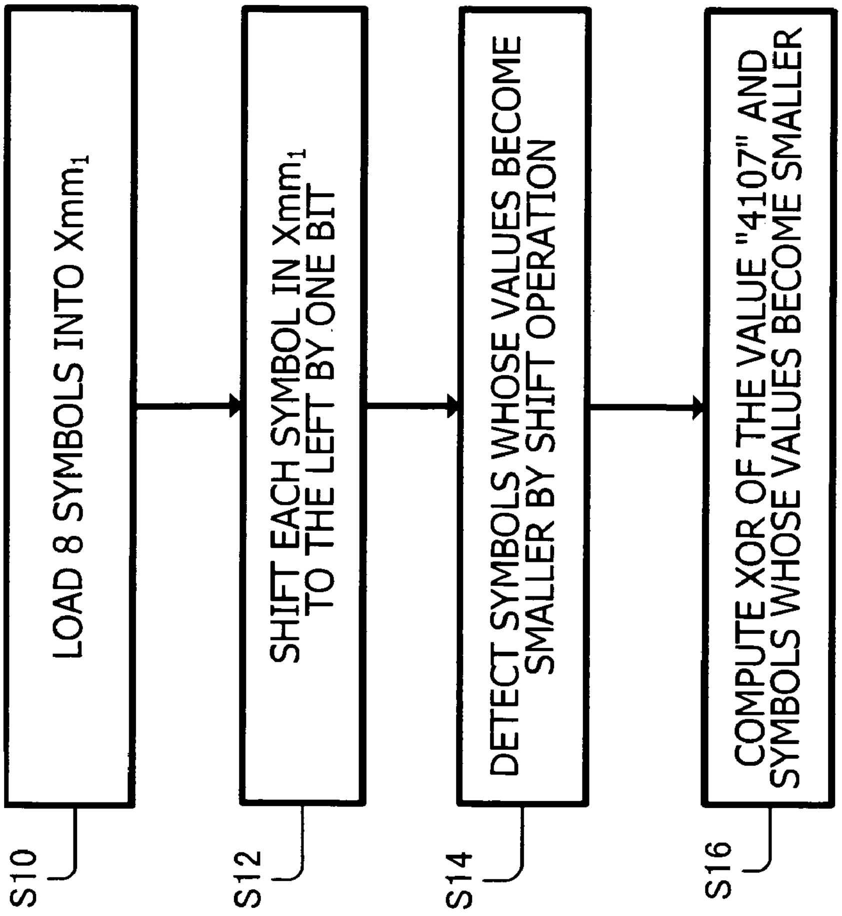
FIG. 3 is a flowchart illustrating Galois field product computation using the parity Q shown in FIG. 2.
Figure 4:
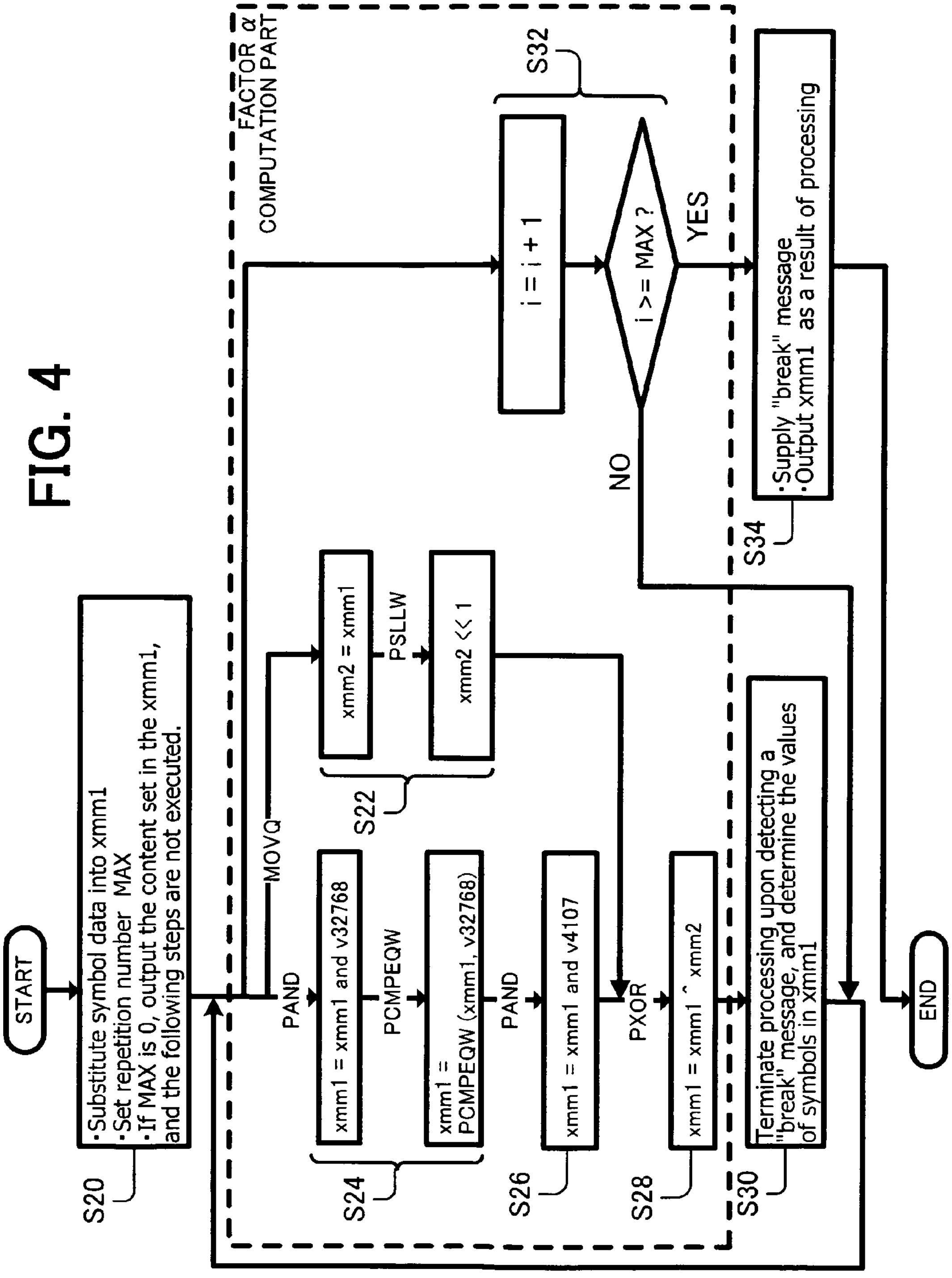
FIG. 4 is a flowchart illustrating details of the Galois field product computation shown in FIG. 3.
Figure 6:
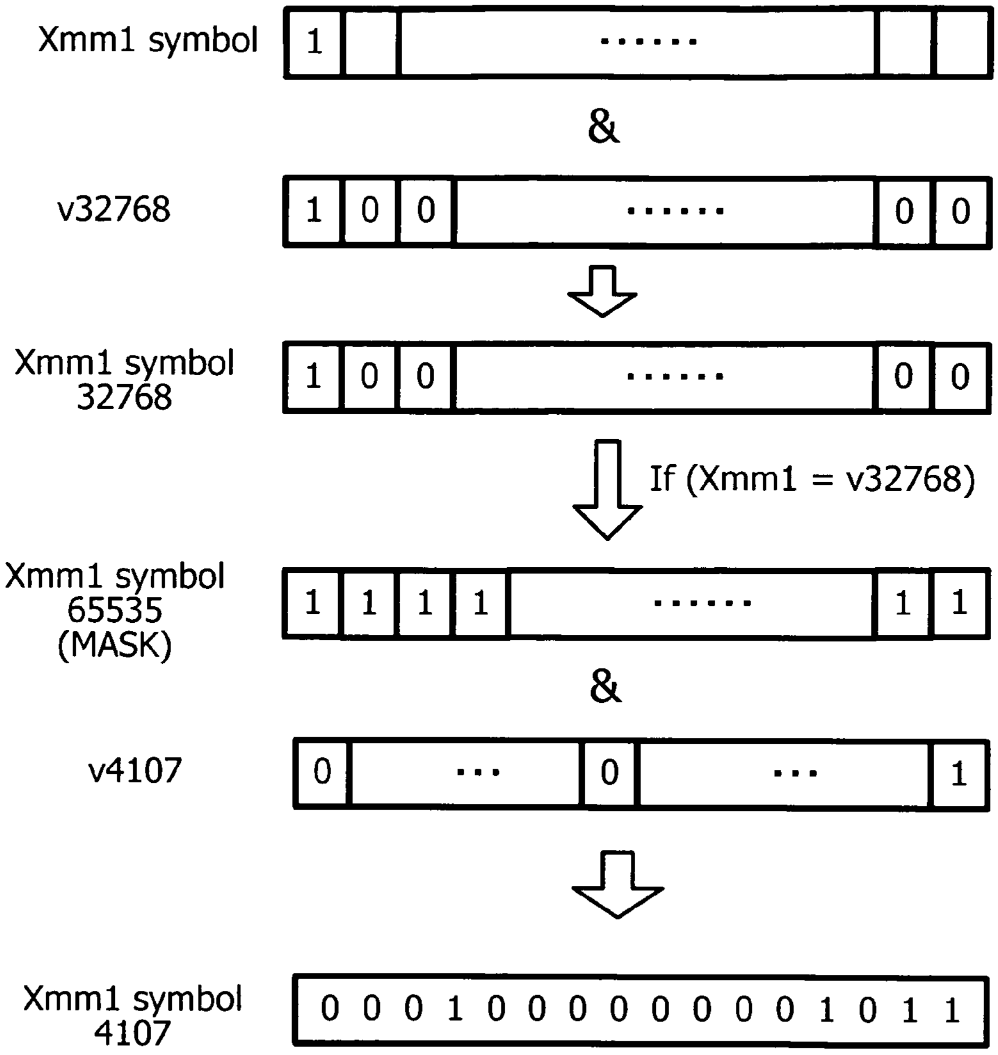
FIG. 6 illustrates a mask generation processing shown in FIG. 5.

FIG. 3 is a flowchart illustrating Galois field product computation according to an embodiment of the present invention. FIG. 4 is a flowchart illustrating details of the Galois field product computation shown in FIG. 3. FIG. 5 illustrates a specific example of the flowcharts shown in FIGS. 3 and 4. FIG. 6 illustrates product computation for symbols in which a carry is generated.

In FIGS. 3 through 6, it is assumed that one symbol has 16 bits and 8 symbols are subjected to parallel processing. For example, CPUs produced by Intel® Corporation have MMX instruction sets. The MMX instruction sets use xmm registers. By the use of the xmm registers, parallel processing is executed. The xmm register length is 16 bytes, and thus, if one symbol has 16 bits, 8 symbols can be subjected to weighting parallel processing.

The basic processing for Galois field product computation is discussed below with reference to the flowchart in FIG. 3.

In step S10, 8 symbols (symbol data) are loaded into an $xmm_1$ register.

Then, in step S12, each symbol in the $xmm_1$ register is shifted to the left by one bit so that the value of each symbol is doubled.

In step S14, by the use of the mask value, symbols whose values become smaller by a shift operation are detected (i.e., symbols in which a carry is generated in MSBs).

In step S16, after the shift operation, among the 8 symbols, XOR of the predetermined value "4107" and the symbols whose values become smaller is computed.

An example of details of the weighting processing using MMX is given below with referenced to the flowchart in FIG. 4.

In the example shown in FIG. 4, for convenience of explanation, it is assumed that the process from step S24 to step S26, the process of step S22, and the process of step S32 proceed in parallel. However, it is also possible to configure the weighting processing so that the above mentioned three processes proceed in series by inserting step S22 and step S32 with adding appropriate conditional branching steps between step S20 and step S24.

The weighting processing is specifically discussed below with reference to FIGS. 5 and 6 in the context of weighting processing using a Galois field (such processing is referred to as the "Galois field product computation") on data disk number i=2. In the case of the data disk number i=2, the data $D_{i=2}$ is weighted by a factor α according to the polynomial for generating the second parity Q, expressed by equation (1).

In step S20, symbol data including a plurality of symbols is substituted into the $xmm_1$ register, and the repetition number MAX is set. For example, in the case of the disk number i=2, MAX is set to be 1. The repetition number pointer i is initialized to be 0. If MAX is 0, the content set in the $xmm_1$ register is output, and the following steps are not executed. For example, 8 symbols to be weighted, each symbol having 16 bits, are extracted, as shown in FIG. 5, from the data disk number i=2, and are substituted into the $xmm_1$ register (indicated by xmm1 in FIG. 5).

Additionally, 8 symbol data v32768 and v4107 into which "32768" and "4107", respectively, are input as a symbol are prepared. The value "32768" indicates that only the 16th bit is 1 and is used for detecting symbols in which a carry is generated by a shift operation. The value "4107" is the value obtained by substituting x=2 into $x^{12}+x^3+x+1$ of the primitive polynomial $x^{16}+x^{12}+x^3+x+1$ of the 16-bit Galois field $GF(2^{16})$. That is, 4096+8+2+1=4107. 8 symbol data v4107 becomes a first symbol correction value.

In step S22, the data substituted into the $xmm_1$ register is moved to the $xmm_2$ register in accordance with the move instruction (MOVQ). Then, each symbol of the symbol data moved to the $xmm_2$ register is shifted to the left (to a higher order) by one bit in accordance with the shift instruction (PSLLW), as indicated by xmm2 in FIG. 5. Because of this shift operation, the value of each symbol is doubled (multiplication by factor α), and since each symbol has 16 bits, an overflow occurs in the bits in which a carry is generated by the shift operation. Accordingly, after the shift operation, the resulting data contains symbols whose values are doubled, as singly underlined, and symbols whose values are smaller than those before being shifted, as doubly underlined, as indicated by xmm2 in FIG. 5. An overflow occurs in the symbols whose values are smaller before being shifted.

In step S24, XOR of the value "4107" and each of the symbols whose values are decreased is computed. Accordingly, each of the symbols whose values are decreased is first extracted and is changed to all 1's (i.e., 65535). This is explained in more detail with reference to FIG. 6 in addition to FIGS. 4 and 5. In accordance with the AND instruction (PAND), the logical AND of the value of each symbol in the $xmm_1$ register (xmm1 in FIG. 5) and the x32768 value (32768) is computed so that the $xmm_1$ register can be updated. As indicated by the xmm1&v32768 in FIGS. 4 and 5, among the 8 symbols, only the symbols in which an overflow has occurred (symbols whose values are decreased) are substituted by 32768, and the symbols in which an overflow has not occurred are substituted by 0.

It is then determined whether the value of each symbol is to be substituted by 65535 or 0. That is, in accordance with the comparison/maximum-value-setting instruction (PCMPEQW), the value of each symbol as a result of computing the logical AND of xmm1 and V32768 is compared with 32768. If the two values are the same, all the 16 bits of such a symbol are substituted by 1 (=65535). If the two values are not the same, all the 16 bits of such a symbol are substituted by 0 (=0). As a result, a mask for the value 4107, or first mask data is generated.

Then, in step S26, in accordance with the AND instruction (PAND), the logical AND of the value of each symbol in the $xmm_1$ register and the v4107 is computed so that the $xmm_1$ register can be updated. With this operation, among the 8 symbols in the $xmm_1$ register, only the symbols whose values are decreased are substituted by 4107, while the symbols whose values are not decreased are substituted by 0, that is, a first correction data is set in the $xmm_1$ register.

In step S28, in accordance with the XOR instruction (PXOR), XOR of the values of the updated symbols in the $xmm_1$ register (the first correction value) and the values of the corresponding symbols in the $xmm_2$ register (a second symbol data) obtained in step S22 is computed, resulting in the value weighted by a factor $\alpha$.

In step S30, upon detecting a "break" message, the processing is terminated, and the values of the symbols in the $xmm_1$ register are determined. Otherwise, the process returns to step S24.

When Galois field product computation is started, i.e., after step S20, in step S32, the repetition number pointer i is incremented by one. Then, it is determined whether the repetition number pointer i is greater than or equal to the repetition number MAX. If the repetition number pointer i is smaller than the repetition number MAX, the process proceeds to step S24.

If it is determined in step S32 that the repetition number pointer i is greater than or equal to the repetition number MAX, it means that the repetition number MAX has been reached, and the process proceeds to step S34. In step S34, a "break" message is supplied, and xmm1 is output as a result of performing the Galois field product computation.

For example, if the second symbol value 36934 of the data xmm1 in FIG. 5 is simply doubled, the resulting value is 73868. However, since one symbol is restricted to 16 bits, an overflow occurs in the resulting value 73868, and 73868 is reduced to 8332 (=73868−65536) in 16-bit representation. However, the significant bits of the doubled value of the second symbol are 16 bits from the 17th bit to the second bit. To make correction to the significant bits, the correction value 4107 is used for converting the second symbol from 8332 to 12423.

Steps S22 through S28 can all be executed by instructions having a small latency (latency=2), which significantly reduces the processing time. If weighting is performed by a factor $\alpha^j$, steps S22 through S28 are repeated for j times.

Reference is made to FIG. 6 to describe the mask processing of this embodiment. FIG. 6 illustrates the mask processing for extracting symbols whose values are decreased by a shift operation. The logical AND of the value of each symbol in the $xmm_1$ register and v32768 is computed so that the symbols in which an overflow has occurred are distinguished from the symbols in which an overflow has not occurred. Then, the value of each symbol is compared with the value 32768. If the two values are the same, all the bits of such a symbol are substituted by 1 (=65535). Then, a first mask value is generated. Then, the logical AND of the value of each symbol in the $xmm_1$ register and v4107 is computed, resulting in xmm1 where a first correction data is stored.

Figure 17:
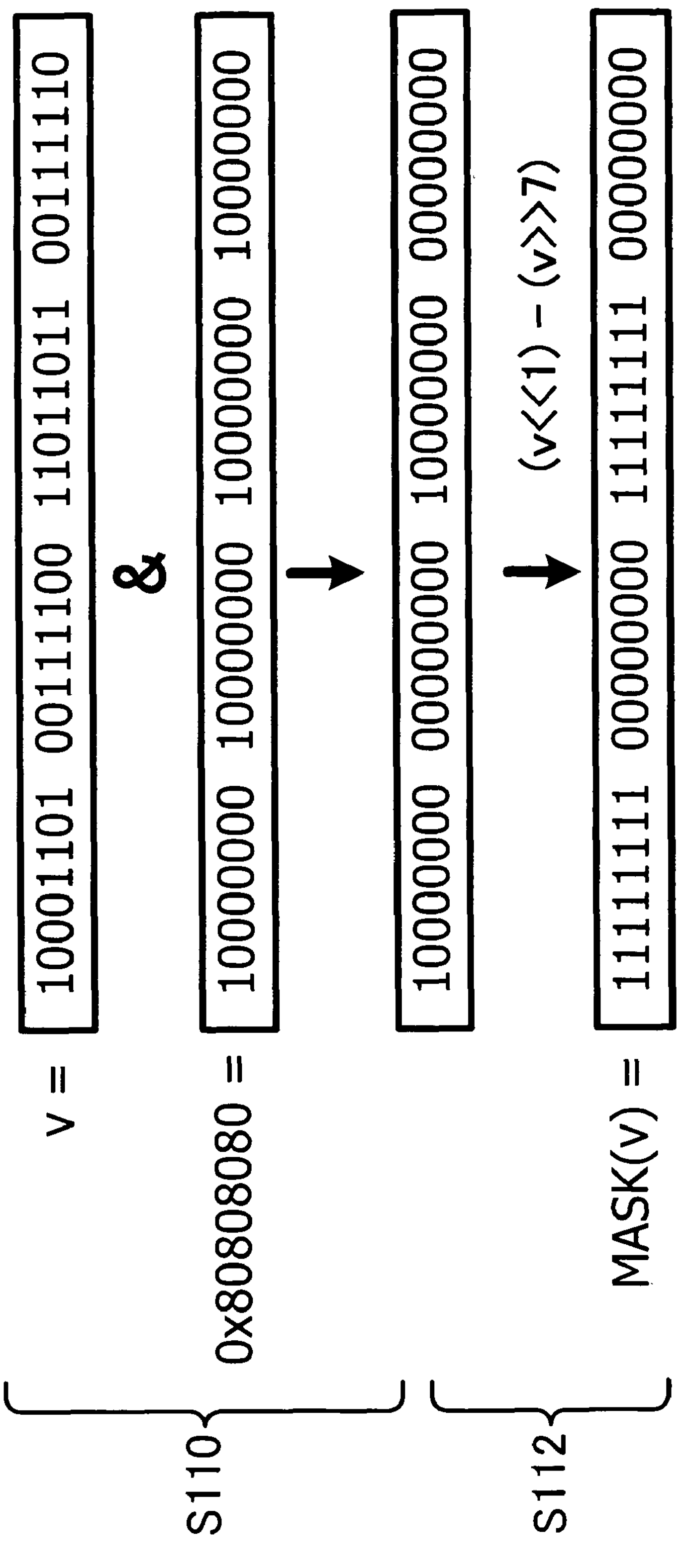
FIG. 17 illustrates an example of mask generation processing of the related art.

In the mask processing of the related art, as shown in FIG. 17, the logical AND of the original symbols v and the value 0x80808080 is computed so that symbols in which an overflow has occurred are distinguished from symbols in which an overflow has not occurred. Then, the logical AND value is shifted to the left by one bit, and also, the logical AND value is shifted to the right by 7 bits. Then, the difference between the two results is used as the mask.

The mask processing of this embodiment shown in FIG. 6 is executed only by two instructions, such as an AND instruction and a comparison instruction. In contrast, the mask processing of the related art shown in FIG. 17 is executed by four instructions, such as an AND instruction, two shift instructions, and a subtraction instruction.

Figure 16:
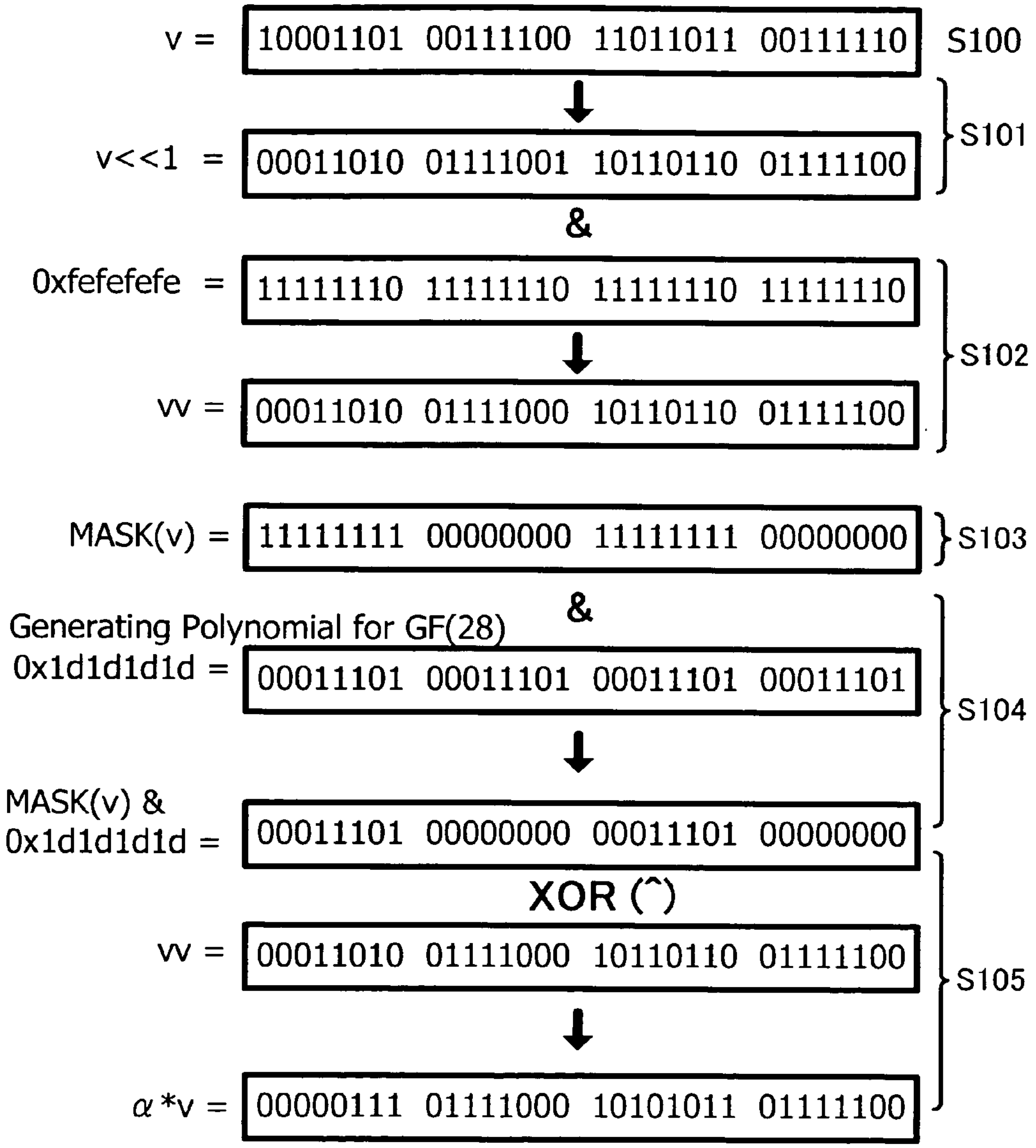
FIG. 16 illustrates an example of Galois field product computation of the related art.

Additionally, in this embodiment, each symbol of the symbol data in the register is independently shifted to the left, as shown in FIG. 5. In contrast, in the related art, the entire register is shifted to the left, i.e., the entire four symbols are shifted at one time, as shown in FIG. 16. Thus, in the related art, after a shift operation, extra processing, such as forcefully substituting the LSB of each symbol by 0, is required so that the LSB of each symbol is not influenced by the MSB of the right adjacent symbol.

Thus, in contrast to the Galois field product computation of the related art executed by 9 instructions, the Galois field product computation of this embodiment can be executed by 6 instructions. That is, only the ⅔ processing time is necessary for multiplying data by a factor $\alpha$. As a result, fast Galois field product computation can be implemented. In the related art, for example, in the case of product computation using $\alpha^{13}$, 9×13=117 instructions (steps) are required. In this embodiment, however, only 6×13=78 instructions (steps) are required. Additionally, in the product computation expressed by equation (1), in the related art, 9×(1+2+3+4+5+6+7+8+9+10+11+12+13=91)=819 instructions are required. In this embodiment, however, only 6×(1+2+3+4+5+6+7+8+9+10+11+12+13=91)=546 instructions are required. Thus, fast Galois field product computation can be implemented.

Additionally, in this embodiment, 8 symbols can be subjected to parallel processing. Thus, in contrast to the related art in which only 4 symbols are subjected to parallel processing, the processing rate can be doubled. As a result, the Galois field product computation can be executed with only the ⅓ processing time.

Figure 7:
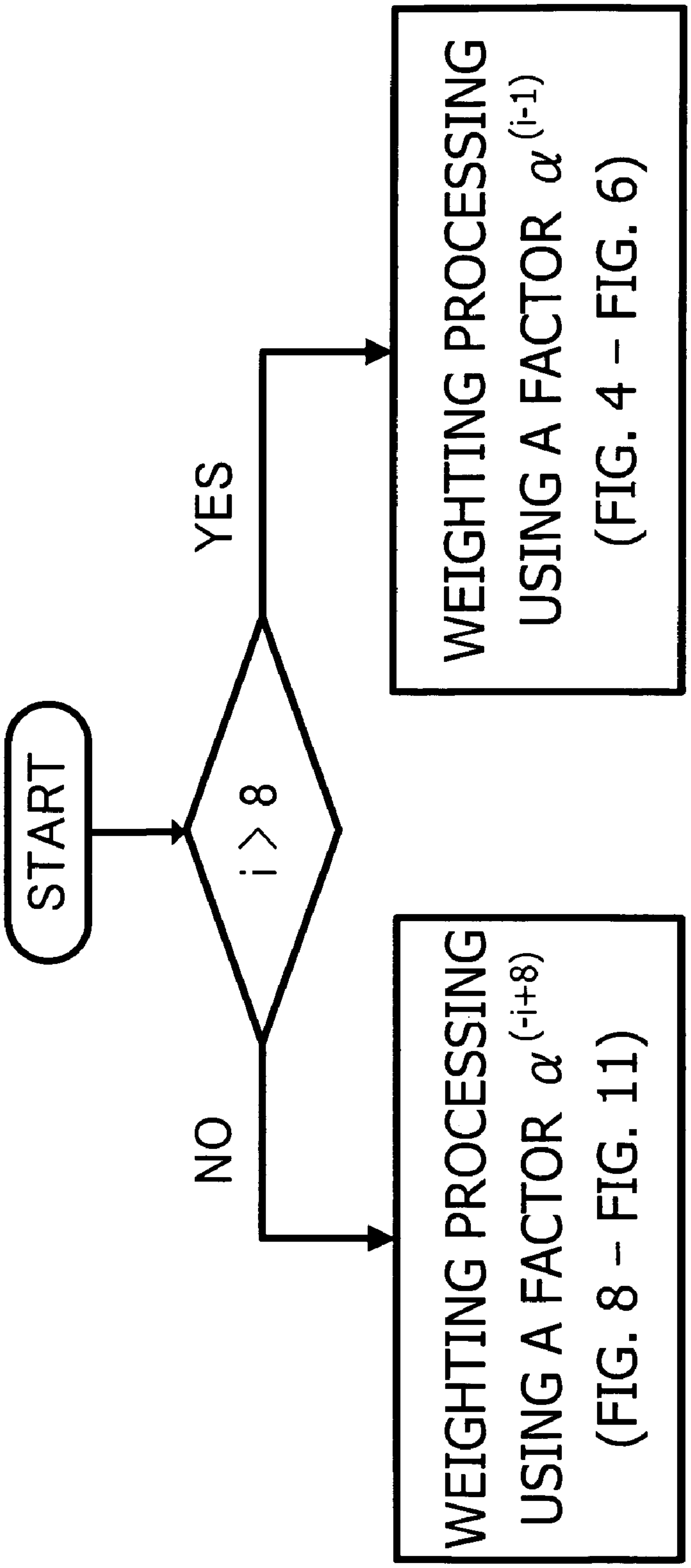
FIG. 7 is a flowchart illustrating Galois field product computation in accordance with another embodiment of the present invention.
Figure 9:
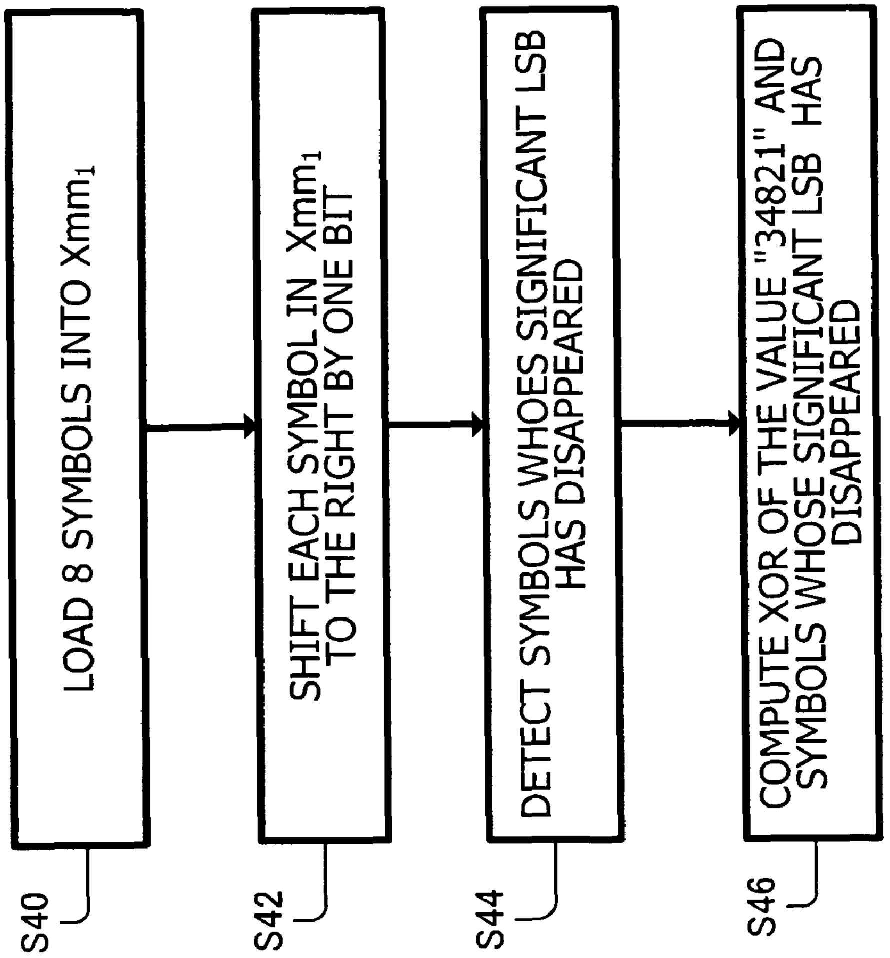
FIG. 9 is a flowchart illustrating product computation processing using parity Q shown in FIG. 8.
Figure 11:
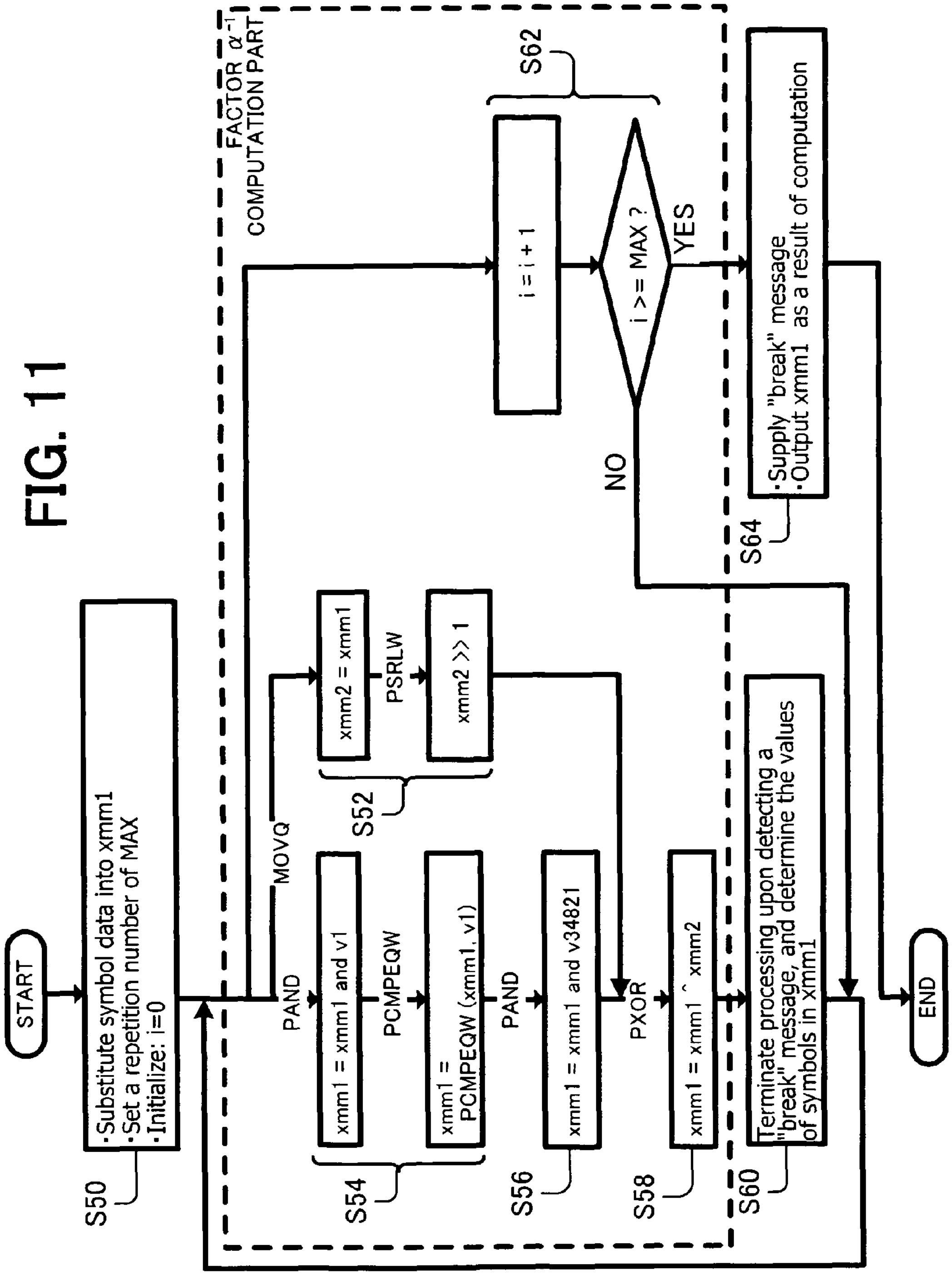
FIG. 11 is a flowchart illustrating details of the product computation processing shown in FIG. 9.

FIG. 7 is a flowchart illustrating Galois field product computation in accordance with another embodiment of the present invention. FIG. 8 illustrates weighting processing employed in the Galois field product computation shown in FIG. 7. FIG. 9 is a flowchart illustrating product computation processing using a factor $\alpha^{-1}$ in the Galois field product computation shown in FIG. 7. FIG. 10 illustrates a procedure for the product computation processing shown in FIG. 9. FIG. 11 is a flowchart illustrating details of the product computation processing indicated by the flowchart in FIG. 9.

In the above-described embodiment, the processing time for one operation for the Galois field product computation is reduced. In this embodiment, the Galois field generators are determined so that the number of loops of an algorithm for product computation parallel processing can be decreased, and thus, the entire Galois field product computation time can be reduced.

It is now assumed that 14 data disk units are provided, as shown in FIGS. 1 and 2. In this case, if the data disk number i(=1 to 14) is one of 1 to 8, weighting processing is performed by multiplying data by a factor $\alpha^{i-1}$ according to the weighting computation shown in FIGS. 4 through 6. If the disk number i is one of 9 to 14, weighting processing is performed by multiplying data by a factor $\alpha^{-i+8}$ according to a weighting algorithm using a factor $\alpha^{i-1}$, which is described below with reference to FIGS. 8 through 11.

The two types of weighting processing can be generated as follows. It is now assumed that N data disk units are provided. In this case, if the data disk number i is one of 1 to S+1, where S represents the minimum integer greater than (N−1)/2, weighting is performed by a factor $\alpha^{i-1}$ according to the weighting computation shown in FIGS. 4 through 6. If the data disk number i is one of S+2 to N, weighting is performed by a factor $\alpha^{-i+S+1}$.

The weighting processing by a factor α has been discussed with reference to FIGS. 4 through 6, and an explanation thereof is thus omitted here, and only weighting processing by a factor $\alpha^{-1}$ is described below with reference to FIGS. 8 through 11.

The first parity P is generated, as shown in FIG. 8, by computing XOR of the data string D1 through D14 in the data disk units 10-1 through 10-14, respectively, and is stored at the corresponding address of the first parity disk unit 10-15. The second parity Q is generated, as shown in FIG. 8, by weighting the string data D1 through D14 in the data disk units 10-1 through 10-14, respectively, by means of Galois field product computation and by computing XOR of the resulting weighted data. The generated second parity Q is stored at the corresponding address of the second parity disk unit 10-16. That is, the second parity Q is computed by the following equation (3).

$$Q=\alpha^0\times D_1+\alpha^1\times D_2+\alpha^2\times D_3+\ldots+\alpha^7\times D_8+\alpha^{-1}\times D_9+\ldots+{}^{-6}\times D_{14} \quad (3)$$

where + in equation (3) indicates XOR computation. The parity computation is executed by the RAID controller 12. If one symbol has 16 bits, the Galois field is $GF(2^{16})$, and the primitive polynomial is expressed by the above-described equation (2).

The value “1”, in which only the LSB of the 16-bit data is 1, is used for generating mask data (a second mask data) for the Galois field product computation using a factor $\alpha^{-1}$. The value “34821”, which is used as a second symbol correction value, is generated by dividing the primitive polynomial expressed by equation (2) by x and by substituting 2 into x of the resulting value.

When writing data into the data disk units 10-1 through 10-14, the RAID controller 12 calculates the first parity P by means of XOR computation and stores the calculated first parity P in the first parity disk unit 10-15, and also calculates the second parity Q by performing Galois field product computation and XOR computation, which are discussed below, and stores the calculated second parity Q in the second parity disk unit 10-16.

In FIGS. 9 through 11, it is assumed that one symbol has 16 bits and 8 symbols are subjected to parallel processing. For example, CPUs produced by Intel® Corporation have MMX instruction sets. The MMX instruction sets use xmm registers. By the use of the xmm registers, parallel processing is executed. The xmm register length is 16 bytes, and thus, if one symbol has 16 bits, 8 symbols can be subjected to weighting parallel processing.

The basic processing for Galois field product computation using a factor $\alpha^{-1}$ is discussed below with reference to the flowchart in FIG. 9.

In step S40, 8 symbols are loaded into the $xmm_1$ register.

Then, in step S42, each symbol in the $xmm_1$ register is shifted to the right (to a lower order) by one bit so that the value of each symbol is reduced by ½.

In step S44, by the use of the value v1, symbols in which a bit place is cancelled (i.e., the LSB 1 has disappeared) by a shift operation are detected.

In step S46, after the shift operation, among the 8 symbols, XOR of the predetermined value “34821” and the symbols whose LSBs have disappeared is computed.

An example of details of the weighting processing using MMX are given below with referenced to the flowchart in FIG. 11. The weighting processing is also specifically discussed below with reference to FIG. 10 in the context of Galois field product computation using a factor of $\alpha^{-1}$ performed on data disk number i=9. In the case of the data disk number i=9, the data $D_{i=9}$ is weighted by the use of a factor $\alpha^{-1}$ according to the polynomial for generating the second parity Q, expressed by equation (3).

In the example shown in FIG. 11, for convenience of explanation, it is assumed that the process from step S54 to step S56, the process of step S52, and the process of step S62 proceed in parallel. However, it is also possible to configure the weighting processing so that the above mentioned three processes proceed in series by inserting step S52 and step S62 with adding appropriate conditional branching steps between step S50 and step S54.

In step S50, the symbol data in the data disk number i=9 is substituted into the $xmm_1$ register, and the repetition number MAX is set. For example, in the case of the disk number i=9, MAX is set to be 1. The repetition number pointer i is initialized to be 0. For example, 8 symbols to be weighted, each symbol having 16 bits, are extracted, in a manner similar to that shown in FIG. 5, from the data disk number i=9, and are substituted into the $xmm_1$ register (indicated by xmm1 in (1) in FIG. 10).

Additionally, 8 symbol data v1 and v34821 into which “1” and “34821”, respectively, are input are prepared. The value “1” indicates that only the LSB is 1 and is used for detecting symbols in which the LSB disappears by a shift operation in the right direction. 8 symbol data v34821 becomes a second symbol correction value.

The value “34821” is the value obtained by removing 1 from the primitive polynomial $x^{16}+x^{12}+x^3+x+1$ and by dividing the resulting value by x and also by substituting x=2 into the resulting polynomial $x^{15}+x^{11}+x^2+1$. This means that $\alpha^{16}+\alpha^{12}+\alpha^3+\alpha=1$ holds true according to the principle that the primitive polynomial of the 16-bit Galois field $GF(2^{16})$ $\alpha^{16}+\alpha^{12}+\alpha^3+1=0$. Substituting 2 into α obtains 69642=1. If both the sides are shifted to the right (to a lower order) by one bit, the value “34821” disappears. If the 16-bit data is shifted to the right when the right side contains “1”, “1” in the right side disappears. Accordingly, XOR of the data and 34821 is computed so that the value can be corrected.

In step S52, the data substituted into the $xmm_1$ register is moved to the $xmm_2$ register in accordance with the move instruction (MOVQ). Then, each symbol of the data moved to the $xmm_2$ register is shifted to the right (to a lower order) by one bit in accordance with the shift instruction (PSRLW), as indicated by xmm2 in (2) in FIG. 10. Because of this shift operation, the value of each symbol is reduced by ½ (multiplication by a factor $\alpha^{-1}$, and since each symbol has 16 bits, an underflow occurs in the bits disappeared by the shift operation. Accordingly, after the shift operation, the resulting data, which becomes a third symbol data, contains symbols whose values are reduced by ½ and symbols whose bits have disappeared.

In step S54, XOR of the value "34821" and each of the symbols with disappeared bits is computed. Accordingly, each of the symbols with disappeared bits is first extracted and is changed to all 1's (i.e., 65535). More specifically, in accordance with the AND instruction (PAND), the logical AND of the value of each symbol in the $xmm_1$ register (xmm1 in FIG. 5) and the x1 value "1" is computed so that the $xmm_1$ register can be updated. As indicated by xmm1&v1, among the 8 symbols, only the symbols whose LSBs are 1 are substituted by 1, and the other symbols are substituted by 0.

It is then determined whether the value of each symbol is to be substituted by 65535 or 0. That is, in accordance with the comparison/maximum-value-setting instruction (PCMPEQW), the value of each symbol obtained as a result of computing the logical AND of xmm1 and v1 is compared with 1. If the two values are the same, all the 16 bits of such a symbol are substituted by 1 (=65535). If the two values are not the same, all the 16 bits of such a symbol are substituted by 0 (=0). As a result, a mask having the value 34821, or second mask data, is generated.

Then, in step S56, in accordance with the AND instruction (PAND), the logical AND of the value of each symbol in the $xmm_1$ register and the v34821 is computed so that the $xmm_1$ register can be updated. With this operation, among the 8 symbols in the $xmm_1$ register, only the symbols whose LSBs are 1 are substituted by 34821, while the other symbols are substituted by 0. This data included in the $xmm_1$ register becomes second mask data.

In step S58, in accordance with the XOR instruction (PXOR), XOR of the values of the updated symbols in the $xmm_1$ register and the values of the corresponding symbols in the $xmm_2$ register obtained in step S52 is computed, resulting in the value weighted by a factor $\alpha^{-1}$.

In step S60, upon detecting a "break" message, the processing is terminated, and the values of the symbols in the $xmm_1$ register are determined. Otherwise, the process returns to step S54.

When Galois field product computation is started, i.e., after step S50, in step S62, the repetition number pointer i is incremented by one. Then, it is determined whether the repetition number pointer i is greater than or equal to the repetition number MAX. If the repetition number pointer i is smaller than the repetition number MAX, the process proceeds to step S54.

If it is determined in step S62 that the repetition number pointer i is greater than or equal to the repetition number MAX, it means that the repetition number MAX has been reached, and the process proceeds to step S64. In step S64, a "break" message is supplied, and xmm1 is output as a result of performing the Galois field product computation.

As described above, the feature of the weighting algorithm with a factor $\alpha^{-1}$ resides in that the value substituted into the xmm register is shifted to the right by one bit. The basic concept is the same as that for the weighting algorithm with a factor $\alpha$. As a result of applying the weighting algorithm, the weighting results obtained by the multiplication using a factor $\alpha^{-(i-8)}$ are output for the disk numbers i=9 to 14.

In this manner, it is sufficient if the Galois field generators assigned to the disks are different. It is not essential that the Galois field generators having a power proportional to the disk number i, as expressed by equation (1), be used. By the use of this feature, two types of weighting processing using factors $\alpha$ and $\alpha^{-1}$ are performed, and the weighting results obtained by the use of factors $\alpha^{i-1}$ and $\alpha^{-i+8}$ are allocated to the disk numbers i so that the repetition number can be minimized. With this operation, the number of loops is 7 at a maximum, as shown in FIGS. 7 and 8.

If only the Galois field product computation shown in FIG. 4 is employed, the number of loops is 13 at a maximum. Thus, a considerably great effect in reducing the number of loops can be produced by this embodiment.

Additionally, in this embodiment, the weighting processing by factors $\alpha$ and $\alpha^{-1}$ has been discussed in the context of the example shown in FIG. 11. However, another approach to performing product computation by a factor $\alpha$ by repeating one time and to performing product computation by a factor $\alpha^n$ by repeating n times is also applicable.

If the product computation shown in FIG. 11 is employed, Galois field product computation can be executed by 6 instructions, and only the ⅔ processing time is required for multiplication of data by $\alpha$. Thus, fast Galois field product computation can be implemented. Additionally, since 8 symbols can be subjected to parallel processing, the processing speed is almost doubled, compared with the case of the related art in which only 4 symbols can be subjected to parallel processing. As a result, the Galois field product computation can be executed with the ⅓ processing time.

Figure 12:
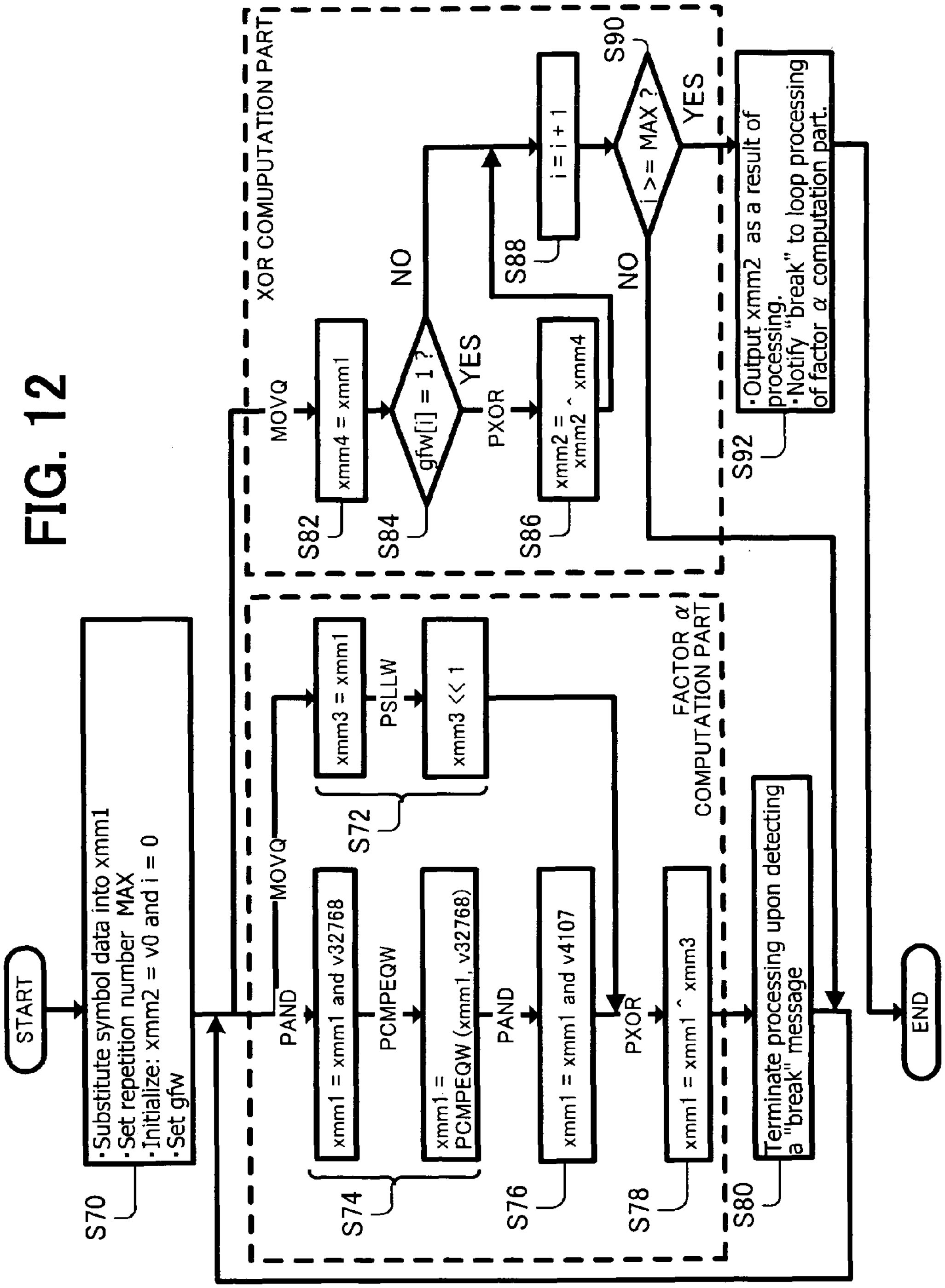
FIG. 12 is a flowchart illustrating Galois field product computation in accordance with still another embodiment of the present invention.
Figure 13:
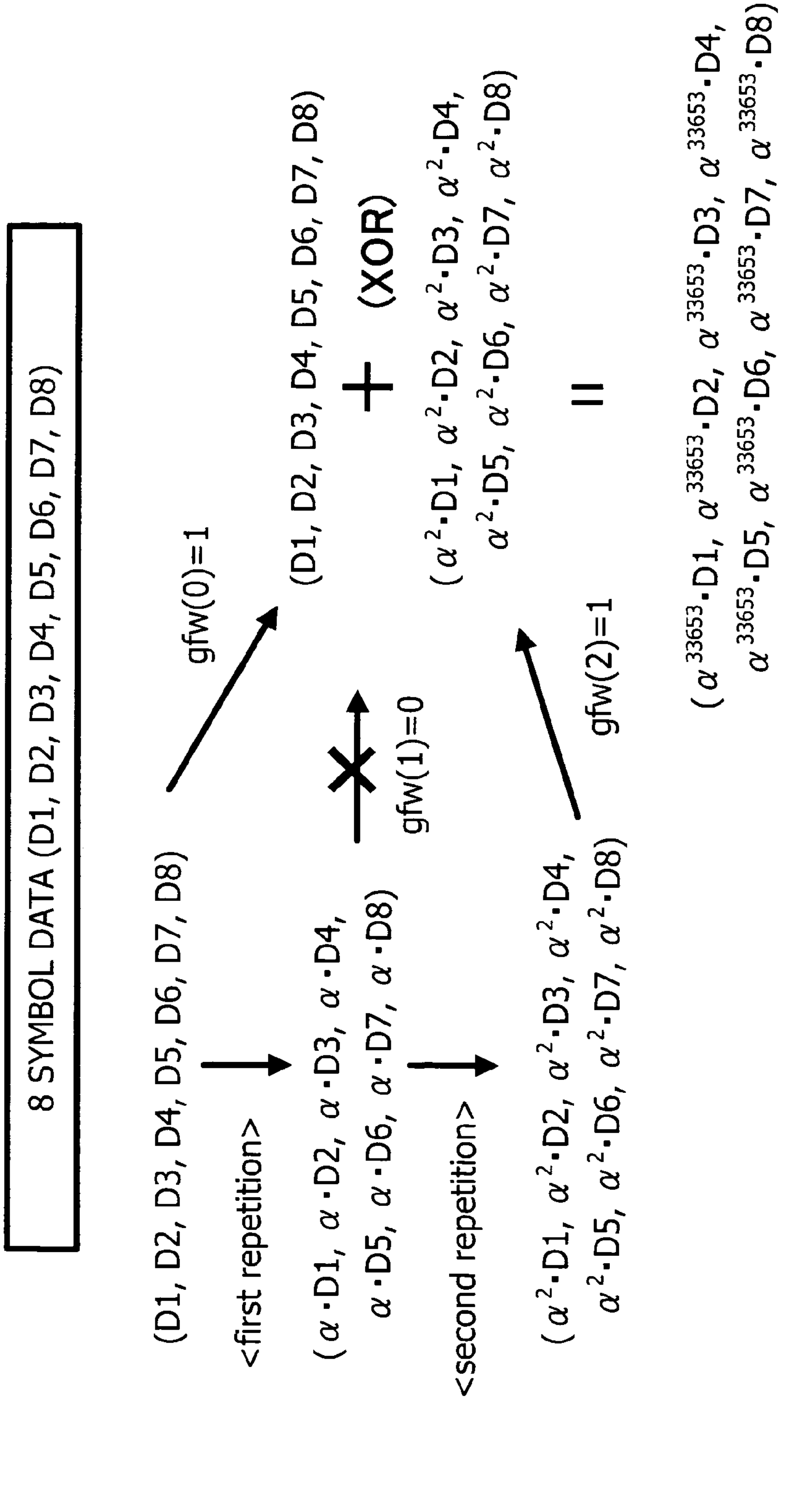
FIG. 13 illustrates the product computation processing shown in FIG. 12.
Figure 14:
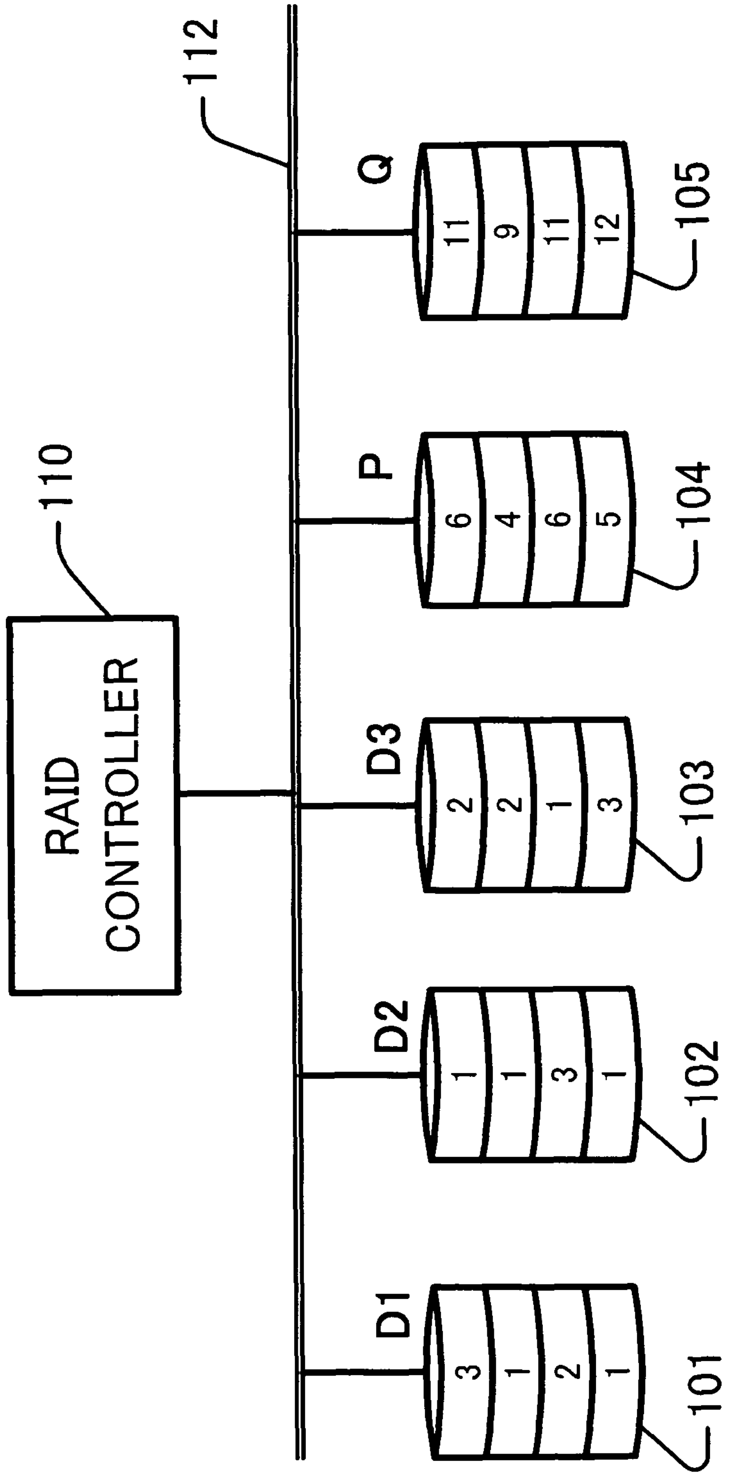
FIG. 14 is a block diagram illustrating the configuration of an example of a RAID-6 system of the related art.

FIG. 12 is a flowchart illustrating Galois field product computation in accordance with still another embodiment of the present invention. FIG. 13 illustrates an example of the Galois field product computation shown in FIG. 12. In this embodiment, in performing the Galois field product computation using a factor $\alpha$ shown in FIGS. 4 through 6, a certain Galois field generator $\alpha^k$ where k is an arbitrary natural number is computed within a repetition number of 15. This product computation is effective when k is a large number and is suitable for recovering data from dual-disk failures.

It is now assumed that the weighting processing using the maximum Galois field generator $\alpha^{33653}$ of the 16-bit Galois field $GF(2^{16})$ is performed, as shown in FIG. 13. In this case, if the weighting algorithm using a factor $\alpha$ shown in FIG. 4 is used, the repetition number becomes 33653. If the weighting algorithm using a factor $\alpha^{-1}$ shown in FIG. 7 is used in this case, the repetition number becomes 31882 because $\alpha^{-31882}=\alpha^{33653}$ in the 16-bit Galois field $GF(2^{16})$. This is not efficient.

Accordingly, in this case, a weighting algorithm for an arbitrary Galois field generator is used. According to this algorithm, the Galois field is expressed in vector representation. The Galois field generator can be expressed by the following equation (4).

$$\alpha^k=gfw(0)\cdot\alpha^0+gfw(1)\cdot\alpha^1+\ldots+gfw(15)\cdot\alpha^{15} \quad (4)$$

where gfw(i) is 0 or 1. That is, the Galois field can be expressed in binary vector representation (gfw(0), gfw(1), . . . , gfw(15)).

To weight one symbol D with $\alpha^k$, the distributive law can be established, as expressed by the following equation (5).

$$\alpha^k\cdot D=(gfw(0)\cdot\alpha^0+gfw(1)\cdot\alpha^1+\ldots+gfw(15)\cdot\alpha^{15})\cdot D=gfw(0)\cdot\alpha^0\cdot D+gfw(1)\cdot\alpha^1\cdot D+\ldots+gfw(15)\cdot\alpha^{15}\cdot D \quad (5)$$

The weighting processing shown in FIGS. 12 and 13 is performed by using this distributive law. For example, when performing weighting by a factor of $\alpha^{33653}$, the following equation (6) can hold true from the Galois field's law.

$$\alpha^{33653}=\alpha^2+\alpha^0 \quad (6)$$

Thus, in the above-described binary vector representation, (gfw(0), gfw(1), . . . , gfw(15))=(1, 0, 1, 0, . . . , 0).

Since the maximum i satisfying the condition that gfw(i)=1 is set is used as a repetition number, the repetition number MAX is set to be 2. This is because that the weighting using $\alpha^3 \cdot D$, $\alpha^4 \cdot D$, . . . is not required, and, by setting the repetition number MAX to be 2, extra repetition processing can be eliminated, thereby decreasing the overall processing time.

FIG. 13 illustrates an example of weighting processing for 8-symbol data. (D1, D2, D3, D4, D5, D6, D7, D8) using a factor $\alpha^{33653}$. By repeating the repetition number MAX(2) times, weighted data $\alpha^{0=1}$, $\alpha^1$, and $\alpha^2$ can be generated. Among the generated data, $\alpha^i$ weighted data in the case of gfw(i)=1 are added (XOR). In this case, $\alpha^0$ and $\alpha^2$ are added (XOR).

According to this operation, from $(\alpha^0 \cdot Dj+\alpha^2 \cdot Dj)$, the target weighted data $\alpha^{33653} \cdot Dj$ (j=1, 2, . . . , 8) can be obtained.

An example of details of this processing is given below with reference to FIG. 12.

In the example shown in FIG. 12, for convenience of explanation, it is assumed that the process from step S74 to step S76, the process of step S72, and the process of the XOR computation part (steps from S82 to S90) proceed in parallel. However, it is also possible to configure the weighting processing so that the above mentioned three processes proceed in series by inserting step S72 and the processing of the XOR computation part with adding appropriate conditional branching steps between step S70 and step S74.

In step S70, the data is substituted into the $xmm_1$ register, and the repetition number MAX is set. The $xmm_2$ register is initialized to v0 (all 0's). The repetition number pointer i is also initialized to be 0. If MAX is 0, the content set in the $xmm_1$ register is output, and the following steps are not executed. The vector gfw is then set.

Additionally, 8 symbol data v32768 and v4107 into which "32768" and "4107", respectively, are input are prepared, as shown in FIG. 4. The value "32768" indicates that only the 16th bit is 1 and is used for detecting symbols in which a carry is generated by a shift operation. The value "4107" is the value obtained by substituting x=2 into $x^{12}+x^3+x+1$ of the primitive polynomial $x^{16}+x^{12}+x^3+x+1$ of the 16-bit Galois field $GF(2^{16})$. That is, 4096+8+2+1=4107.

In step S72, the data substituted into the $xmm_1$ register is moved to the $xmm_3$ register in accordance with the move is moved to the $xmm_3$ register in accordance with the move instruction (MOVQ). Then, each symbol of the data moved to the $xmm_3$ register is shifted to the left (to a higher order) by one bit in accordance with the shift instruction (PSLLW). Because of this shift operation, the value of each symbol is doubled (multiplication by a factor α), and since each symbol has 16 bits, an overflow occurs in the bits in which a carry is generated by the shift operation. Accordingly, after the shift operation, the resulting data contains symbols whose values are doubled and symbols whose values are smaller than those before being shifted. An overflow occurs in the symbols whose values are smaller before being shifted.

In step S74, XOR of the value "4107" and each of the symbols whose values are decreased is computed. Accordingly, each of the symbols whose values are decreased is first extracted and is changed to all 1's (i.e., 65535). More specifically, in accordance with the AND instruction (PAND), the logical AND of the value of each symbol in the $xmm_1$ register and the x32768 value (32768) is computed so that the $xmm_1$ register can be updated. Among the 8 symbols, only the symbols in which an overflow has occurred (symbols whose values are decreased) are substituted by 32768, and the symbols in which an overflow has not occurred are substituted by 0.

It is then determined whether the value of each symbol is to be substituted by 65535 or 0. That is, in accordance with the comparison/maximum-value-setting instruction (PCMPEQW), the value of each symbol as a result of computing the logical AND of xmm1 and V32768 is compared with 32768. If the two values are the same, all the 16 bits of such a symbol are substituted by 1 (=65535). If the two values are not the same, all the 16 bits of such a symbol are substituted by 0 (=0). As a result, a mask having the value 4107 is generated.

Then, in step S76, in accordance with the AND instruction (PAND), the logical AND of the value of each symbol in the $xmm_1$ register and the v4107 is computed so that the $xmm_1$ register can be updated. With this operation, among the 8 symbols in the $xmm_1$ register, only the symbols whose values are decreased are substituted by 4107, while the symbols whose values are not decreased are substituted by 0.

In step S78, in accordance with the XOR instruction (PXOR), XOR of the values of the updated symbols in the $xmm_1$ register and the values of the corresponding symbols in the $xmm_3$ register obtained in step S7.2 is computed, resulting in the value weighted by factor α.

In step S80, upon detecting a "break" message, the processing is terminated, and the values of the symbols in the $xmm_1$ register are determined. Otherwise, the process returns to step S74.

In step S82, in accordance with the move instruction (MOVQ), the processing result in the $xmm_1$ register is copied to the $xmm_4$ register.

It is then determined in step S84 whether gfw(i) of the data is 1.

If gfw(i) is 1, the data is subjected to XOR computation. Thus, in step S86, XOR of the data in the $xmm_2$ register and the data in the $xmm_4$ register is computed so that the $xmm_2$ register can be updated.

In step S88, the repetition number pointer i is incremented by one.

Then, it is determined in step S90 whether the repetition number pointer i is greater than or equal to the repetition number MAX. If the repetition number pointer i is smaller than the repetition number MAX, the process proceeds to step S74.

If it is determined in step S90 that the repetition number pointer i is greater than or equal to the repetition number MAX, it means that the repetition number MAX has been reached, and the process proceeds to step S92. In step S92, a "break" message is supplied to the loop of the α-factor calculator, and xmm2 is output as a result of performing the Galois field product computation.

As described above, the maximum repetition number for weighting processing using a factor $\alpha^k$ can be reduced, which is effective when k is a large value. Thus, this processing is suitable for allowing data to be recovered from dual-disk failures quickly.

In the above-described embodiments, the RAID-6 system has 14 data disk units and two parity disk units. However, the number of data disk units and the number of party disk units are arbitrary.

The parity Q may be generated by the Galois field product computation indicated by the flowchart in FIG. 4 or 11, and recovery from dual-disk failures using the two parities P and Q may be performed by the Galois field product computation indicated by the flowchart in FIG. 12. Then, fast execution of both the generation of parities and recovery of data can be implemented. However, the generation of the parity Q may be performed by the Galois field product computation shown in FIG. 4 or 11, and recovery from dual-disk failures using the two parities P and Q may also be performed by the Galois field product computation shown in FIG. 4 or 11. Alternatively, both the generation of the parity Q and recovery from dual-disk failures using the parities P and Q may be executed by the Galois field product computation shown in FIG. 12 which encompasses the embodiment shown in FIG. 4.

While the present invention has been described with reference to exemplary embodiments, it is to be understood that the invention is not limited to the disclosed exemplary embodiments, and various modifications are possible within the spirit of the invention.

What is claimed is:

1. An apparatus for storing data, comprising:

N data storages each storing a partial data block of N partial data blocks generated by dividing the data, where N is a natural number greater than 1;

a parity storage for storing a first parity data and a second parity data, the first parity data being generated by combining the N partial data blocks, and the second parity data being generated by performing on the N partial data blocks a Galois field product computation; and a controller for dividing the data into the N partial data blocks, generating the first parity data by combining the N partial data blocks, generating the second parity data by performing on the N partial data blocks the Galois field product computation, and storing the generated first and second parity data into the parity storage, wherein the controller performs the Galois field product computation comprising:

acquiring, from one of the N partial data blocks, a first symbol data including a plurality of symbols, each being a bit sequence on which a product operation by a factor $\alpha$ is to be performed in a Galois field, where $\alpha$ is a primitive element of the Galois field; and repeating a factor-$\alpha$ computation M times on the first symbol data, where M is an integer greater than or equal to 0, so as to weight each symbol included in the first symbol data with a weighting factor $\alpha^M$, the factor-$\alpha$ computation comprising:

generating a second symbol data by performing a bit-shift operation on the first symbol data by 1 bit toward the higher-order bit position, generating first mask data including a plurality of mask bit sequences from the first symbol data, each of the plurality of mask bit sequences having a one-to-one correspondence with each of the plurality of symbols in the first symbol data, each mask bit sequence being generated by:

performing an AND operation between the corresponding symbol in the first symbol data and a first fixed value to extract the most significant bit from the symbol, and performing a compare operation between the result of the AND operation and the first fixed value, so as to set all the bits of the mask bit sequence to 1 when the result of the AND operation is equal to the first fixed value, or set to 0 otherwise;

generating first correction data by computing a logical AND of the first mask data and a first symbol correction value which is determined on the basis of a primitive polynomial for the Galois field, generating a factor-$\alpha$ computation result by computing a XOR of the second symbol data and the first correction data, such that the factor-$\alpha$ computation result includes a plurality of symbols, each representing the result of a product operation of the factor $\alpha$ and the corresponding symbol in the first symbol data, and storing the factor-$\alpha$ computation result into the first symbol data as the new first symbol data.

2. The apparatus of claim 1, wherein the controller assigns a weighting number i to each of the N partial data blocks, where is an integer between 0 and N−1, and weights each symbol in the first symbol data acquired from a partial data block having a weighting number i with a weighting factor $\alpha^i$, such that M is set to i.

3. The apparatus of claim 1, wherein the controller further performs the Galois field product computation further comprising:

acquiring a third symbol data including a plurality of symbols from one of the N partial data blocks, each symbol being a bit sequence on which a product operation by a factor $\alpha^{-1}$ is to be performed in a Galois field, and repeating a factor $\alpha^{-1}$ computation K times on the third symbol data, where K is an integer greater than or equal to 0, so as to weight each symbol in the third symbol data with a weighting factor $\alpha^{-K}$, the factor $\alpha^{-1}$ computation comprising:

generating a fourth symbol data by performing a bit-shift operation on the third symbol data by 1 bit toward the lower-order bit position, generating second mask data including a plurality of mask bit sequences from the third symbol data, each of the plurality of mask bit sequences having a one-to-one correspondence with each of the plurality of symbols in the third symbol data, each mask bit sequence being generated by:

performing an AND operation between the corresponding symbol in the third symbol data and a second fixed value to extract the least significant bit from the symbol, and performing a compare operation between the result of the AND operation and the second fixed value, so as to set all the bits of the mask bit sequence to 1 when the result of the AND operation is equal to the second fixed value, or set to 0 otherwise;

generating second correction data by computing a logical AND of the second mask data and a second symbol correction value which is determined on the basis of the primitive polynomial for the Galois field;

generating a factor-$\alpha^{-1}$ computation result by computing a XOR of the fourth symbol data and the second correction data, such that the factor-$\alpha^{-1}$ computation result includes a plurality of symbols, each representing the result of a product operation of the factor $\alpha^{-1}$ and the corresponding symbol in the third symbol data; and storing the factor-$\alpha^{-1}$ computing result into the third symbol data as the new third symbol data.

4. The apparatus of claim 3, wherein the controller assigns a weighting number i to each of the N partial data blocks, where i is an integer between 0 and N−1, to weight each symbol in the first symbol data acquired from a partial data block having a weighting number i between 0 and S with a weighting factor $\alpha^i$, such that M is set to i, and to weight each symbol in the third symbol data acquired from a partial data block having a weighting number i between S+1 and N−1 with a weighting factor $\alpha^{-i+S}$, such that K is set to −i+S, where S is the smallest natural number exceeding (N−1)/2, so as to obtain the second parity data.

5. The apparatus of claim 1, wherein the controller performs the Galois field product computation further comprising:

providing a vector space having a set $(1, \alpha^1, \alpha^2, \ldots, \alpha^{P-1})$, where P is the maximum degree of the primitive polynomial for the Galois field, as a basis of the Galois field;

providing a factor $\alpha^k$ in the Galois field with a binary-vector representation with a dimension P, where k is a natural number;

computing each factor $\alpha^j$ included in the set $(1, \alpha^1, \alpha^2, \ldots, \alpha^{P-1})$, where j is an integer between 0 and P−1, by repeating the factor-α computation j times; and performing a Galois field computation of the factor $\alpha^k$ by executing a XOR operation between one or more of the factor $\alpha^j$.

6. The apparatus of claim 1, wherein the controller restores the data, in the case of failure of a data storage, by using the first parity data, the second parity data, and data stored in one or more data storages other than the failed data storage, by using the Galois field computation.

7. A method for performing a Galois field product computation on data, the method being performed by an apparatus for storing the data, the method comprising:

dividing, by the apparatus, the data into N partial data blocks;

acquiring, by the apparatus, from one of the N partial data blocks, a first symbol data including a plurality of symbols, each being a bit sequence on which a product operation by a factor α is to be performed in a Galois field, where α is a primitive element of the Galois field; and repeating, by the apparatus, a factor-α computation M times on the first symbol data, where M is an integer greater than or equal to 0, so as to weight each symbol in the first symbol data with a weighting factor $\alpha^M$, the factor-α computation comprising:

generating a second symbol data by performing a bit-shift operation on the first symbol data by 1 bit toward the higher-order bit position, generating first mask data including a plurality of mask bit sequence from the first symbol data each of the plurality of mask bit sequences having one-to-one correspondence with each of the plurality of symbols in the first symbol data, each mask bit sequence being generated by:

performing an AND operation between the corresponding symbol in the first symbol data and a first fixed value to extract the most significant bit from the symbol, and performing a compare operation between the result of the AND operation and the first fixed value, so as to set all the bits of the mask bit sequence to 1 when the result of the AND operation is equal to the first fixed value, or set to 0 otherwise, generating first correction data by computing a logical AND of the first mask data and a first symbol correction value which is determined on the basis of a primitive polynomial for the Galois field, generating a factor-α computation result by computing a XOR of the second symbol data and the first correction data, such that the factor-α computation result includes a plurality of symbols, each represents the result of a product operation of the factor α and the corresponding symbol in the first symbol, and storing the factor-α computation result into the first symbol data as a new first symbol data.

8. The method of claim 7, further comprising:

providing each of the N partial data blocks, from which the first symbol data is acquired, with a weighting number i, where N is a natural number and i is an integer between 0 and N−1; and weighting each symbol in the first symbol data included in a partial data block having a weighting number i, with a weighting factor $\alpha^i$, such that M is set to i.

9. The method of claim 7, further comprising:

providing a third symbol data including a plurality of symbols, each being a bit sequence on which a product operation by a factor $\alpha^{-1}$ is to be performed in a Galois field; and repeating a factor-$\alpha^{-1}$ computation K times on the third symbol data, where K is an integer greater than or equal to 0, so as to weight each symbol included in the third symbol data with a weighting factor $\alpha^{-K}$, wherein the factor-$\alpha^{-1}$ computation comprises:

generating a fourth symbol data by performing a bit-shift operation on the third symbol data by 1 bit toward the lower-order bit position, generating second mask data including a plurality of mask bit sequences from the third symbol data, each of the plurality of mask bit sequences having a one-to-one correspondence with each of the plurality of symbols in the third symbol data, each mask bit sequence being generated by:

performing an AND operation between the corresponding symbol in the third symbol data and a second fixed value to extract the least significant bit from the symbol, and performing a compare operation between the result of the AND operation and the second fixed value, so as to set all the bits of the mask bit sequence to 1 when the result of the AND operation is equal to the second fixed value, or set to 0 otherwise, generating second correction data by computing a logical AND of the second mask data and a second symbol correction value which is determined on the basis of the primitive polynomial for the Galois field, and generating a factor-$\alpha^{-1}$ computation result by computing a XOR of the fourth symbol data and the second correction data, such that the factor-$\alpha^{-1}$ computation result includes a plurality of symbols, each representing the result of a product operation of the factor $\alpha^{-1}$ and the corresponding symbol in the third symbol data.

10. The method of claim 9, further comprising:

providing each of the N partial data blocks, from which the first and the third symbol data is acquired, with a weighting number i, where N is a natural number and i is an integer between 0 and N−1;

weighting each symbol in the first symbol data included in a partial data block having a weighting number i between 0 and S with a weighting factor $\alpha^i$, such that M is set to i, where S is the smallest natural number exceeding (N−1)/2; and weighting each symbol in the third symbol data included in a partial data block having a weighting number i between S+1 and N−1 with a weighting factor $\alpha^{-i+S}$, such that K is set to −i+S.

11. The method of claim 7, further comprising:

providing a vector space having a set $(1, \alpha^1, \alpha^2, \ldots, \alpha^{P-1})$, where P is the maximum degree of the primitive polynomial for the Galois field, as a basis of the Galois field;

providing a factor $\alpha^k$ in the Galois field with a binary-vector representation with a dimension P, where k is a natural number;

computing each factor $\alpha^j$ included in the set $(1, \alpha^1, \alpha^2, \ldots, \alpha^{P-1})$, where i is an integer between 0 and P−1, by repeating the factor-α computation j times; and performing a Galois field computation of the factor $\alpha^k$ by executing a XOR operation between one or more of the factor $\alpha^j$, selected from the set on the basis of the binary-vector representation.

* * * * *